United States Patent
Ishiguro et al.

[11] Patent Number: 5,892,192
[45] Date of Patent: *Apr. 6, 1999

[54] OPERATION DEVICE FOR VEHICLE AIR CONDITIONER

[75] Inventors: Kazuyoshi Ishiguro; Toshiki Akita, both of Aichi, Japan

[73] Assignee: Kabushiki Kaisha Tokai Rika Denki Seisakusho, Niwa-gun, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 733,738

[22] Filed: Oct. 18, 1996

[30] Foreign Application Priority Data

Oct. 23, 1995 [JP] Japan .................................. 7-299081

[51] Int. Cl.$^6$ .............................. H01H 9/26; H01H 9/00
[52] U.S. Cl. .......................................... 200/5 R; 200/314
[58] Field of Search .................................. 200/308–317, 200/295, 296, 5 A, 512, 513, 5 R

[56] References Cited

U.S. PATENT DOCUMENTS

| | | | |
|---|---|---|---|
| 4,431,879 | 2/1984 | Fujita et al. .......................... | 200/314 |
| 4,987,279 | 1/1991 | Hirose et al. ......................... | 200/314 |
| 5,045,656 | 9/1991 | Kojima .................................. | 200/314 |
| 5,399,820 | 3/1995 | Silfast ................................... | 200/314 |
| 5,471,023 | 11/1995 | Kaizu et al. .......................... | 200/310 |
| 5,504,661 | 4/1996 | Szpak .................................... | 362/30 |

FOREIGN PATENT DOCUMENTS 5-325703  12/1993  Japan .
6-283077  10/1994  Japan .

Primary Examiner—Wynn Wood Coggins
Assistant Examiner—Michael J. Hayes
Attorney, Agent, or Firm—Morgan, Lewis & Bockius LLP

[57] ABSTRACT

An operation device for a vehicle, capable of being used in a vehicle air conditioner system. The operation device has front panels that have a light transmissive portion, and a flexible printed circuit board shaped to correspond to the arrangement of the front panels. The flexible printed circuit board includes a plurality of light emitting elements at positions respectively corresponding to the positions of the front panels. There are switching means, disposed at the rear of the printed circuit and arranged so that these switching means are operated in response to the operation of the front panels. The rear portion of the front panel can be moved together with light emitting elements in response to the operation of the front panel.

6 Claims, 5 Drawing Sheets

OPERATION DEVICE FOR VEHICLE AIR CONDITIONER

BACKGROUND OF THE INVENTION

1. Field of the invention

The present invention relates to an operation device for a vehicle air conditioner and, in particular, to an operation device including an illumination type operation switch.

2. Related art

Conventionally, in an operation device for a vehicle air conditioner, there generally are light transmissive front panels with light being projected from the back surfaces of the respective front panels to enhance the visibility of the operation device.

This type of an operation device for a vehicle air conditioner is structured such that lights from a plurality of light emitting elements of high luminance are guided to the central portions of the back surfaces of the respective front panels by lightguides each having a high light-transmittance, and The operation device also has switch means, each having an electric function which are disposed in the peripheral edge portions of the back surfaces of the respective front panels. A switch of this illumination type, as disclosed in Japanese Patent Publication No. 6-283077 of Heisei or Japanese Patent Publication No. 5-325703 of Heisei, illustrates a structure in which light emitting elements are respectively disposed in the central portions of the back surfaces of the respective front panels, while switch means are respectively disposed in the peripheral edge portions of the back surfaces of the respective front panels.

However, in the above-mentioned conventional operation device for a vehicle air conditioner, it is difficult to achieve both ease of operation and accurate visibility of the switches. The above-mentioned various kinds of illumination type switches are structured such that a light guide for enhancing the visibility of a light emitting element is disposed in the central portion of the back surface of each front panel. Thus, the function of the operation switch is displayed substantially in the central portion of the front panel. Moreover, the illumination of the front panel in the portion where the function of the operation switch is displayed works effectively.

However, by placing the illuminating portion of the switch in the center portion of the front panel, the switch means, which is allowed to perform its switching operation when the front panel is operated, cannot be placed in the center portion of the front panel. The switch means must be disposed in the peripheral edge of the back surface of the front panel. Therefore, when the front panel is operated, a force to incline the front panel can be applied to the front panel.

Moreover, it is difficult to operate device because the relationship between the illuminating elements and the operational switches, are reversed. On the other hand when the switch is placed in the central portion of the front panel, the operation of the switch means can be truly improved, but the illumination efficiency of the front panel is lowered, thus impairing the superiority of the operation switch of an illumination type.

SUMMARY OF THE INVENTION

The present invention aims at solving the above-mentioned problems found in the conventional operation devices for a vehicle air conditioner. Accordingly, it is an object of the invention to provide an operation device for a vehicle air that provides both ease of operation and accurate visibility of the illuminated switches.

In attaining the above object, according to the invention, there is provided an operation device for a vehicle air conditioner, comprising:

- a plurality of front panels each including a light transmissive portion;
- a flexible print circuit board having a shape corresponding to the arrangement of the plurality of front panels, the flexible print circuit board including a plurality of light emitting elements at the positions thereof respectively corresponding to the positions of the plurality of front panels, and further including electric wires for supplying electric power to the light emitting elements;
- the printed circuit board being structured in accordance with the arrangement of the plurality of front panels in such a manner that the portions thereof respectively situated in the rear of the respective front panels can be respectively moved together with the light emitting elements in response to the operation of the front panels; and,
- a plurality of switch means respectively disposed in the rear of the printed circuit board and arranged in such a manner that they can be operated in response to the operation of the front panels.

According to the present operation device for a vehicle air conditioner, since the light emitting elements are mounted on a flexible printed circuit board that corresponding is disposed at a position to the positions of the switches on the front panels, the operation of the switches as well as the light emitting positions, can be set freely. Thus, not only the visual confirmability of a switch of an illumination type but also the operation reliability of the switch can be enhanced.

Also, according to the invention, the light emitting elements can be composed of chip LEDs that are mounted on the front surface of the printed circuit board. On the back surface of the printed circuit can be mounted protection members that are assembled with the front panels, respectively. This embodiment of the invention, eliminates the need to solder leads or the like to the light emitting elements, thereby improving both the productivity of the present operation device and the yield thereof. Further, since the light emitting means can be formed thinner, even if the light emitting elements and switches are arranged in layers, the whole operation device can be made thin. Thus, it is possible to provide a vehicle air conditioner operation device which can be installed easily, even in a limited vehicle space.

DETAILED DESCRIPTION OF THE PREFERRED EMBODIMENTS

Figure 1:
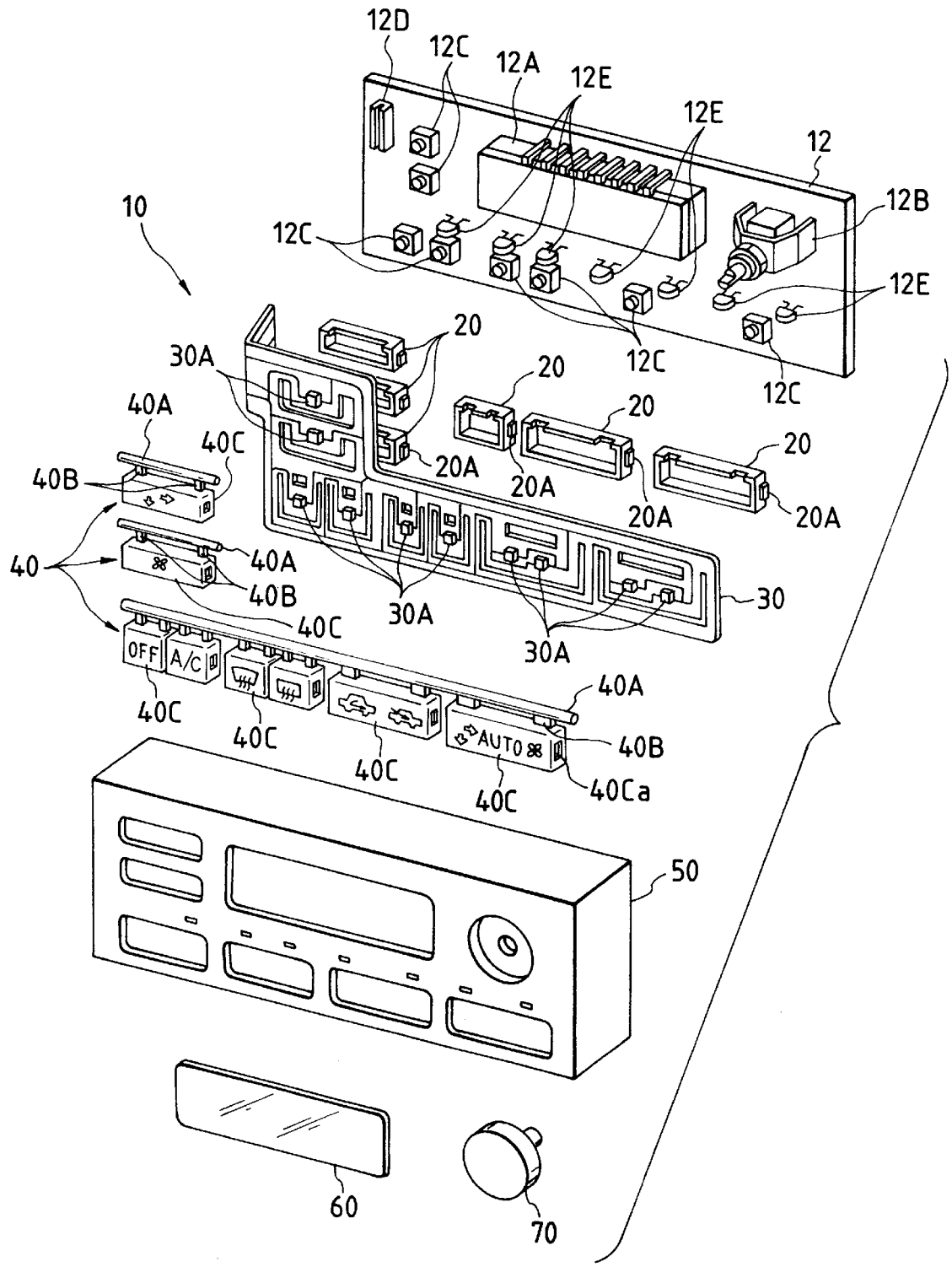
FIG. 1 is an exploded perspective view of a first embodiment of an operation device for a vehicle air conditioner according to the invention.
Figure 2:
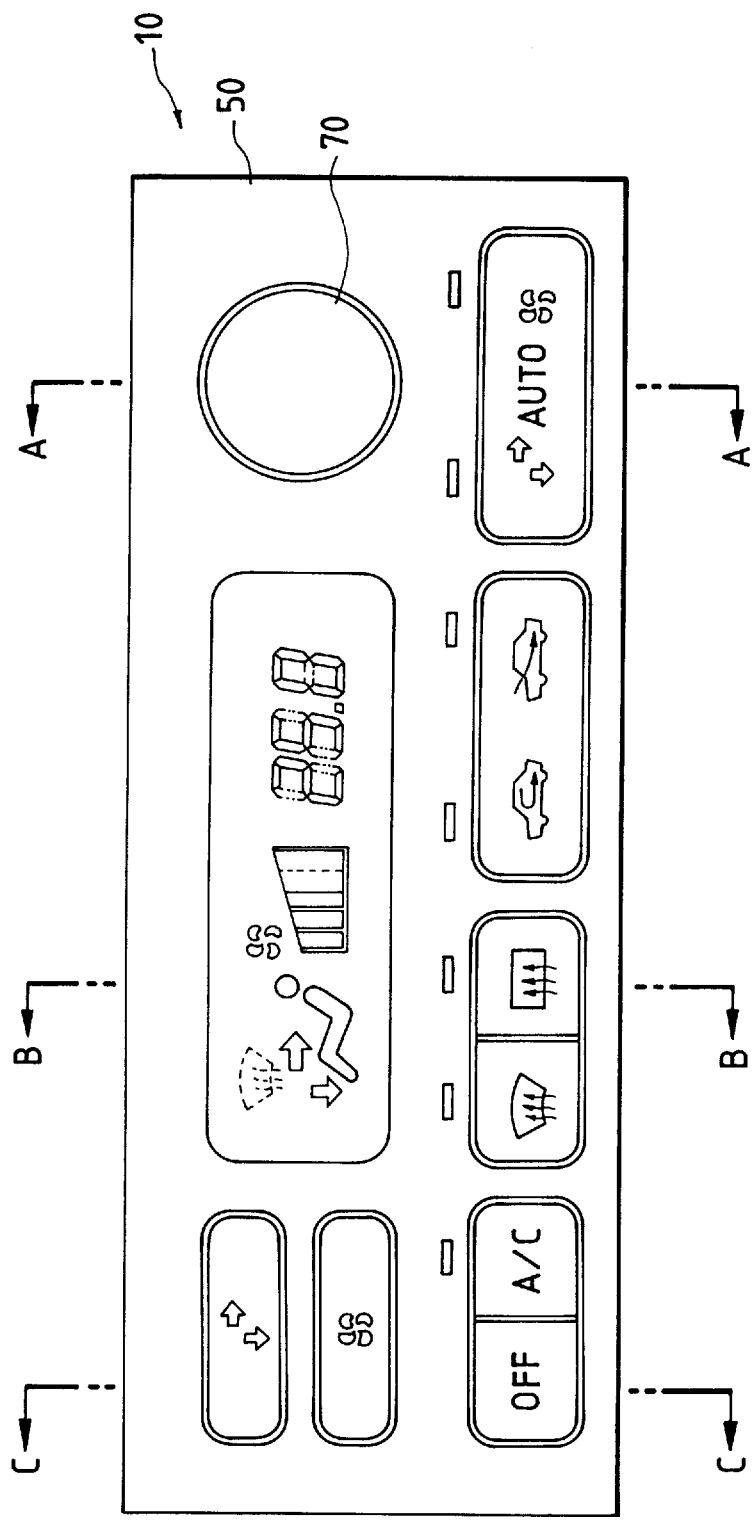
FIG. 2 is a front view of the vehicle air conditioner operation device shown in FIG. 1.

Description will be given below of first and second embodiments of an operation device for a vehicle air conditioner according to the above-mentioned invention with reference to the accompanying drawings. FIG. 1 is an exploded perspective view of the structure of an operation device for a vehicle air conditioner, which is a first embodiment according to the invention. FIG. 2 is a front view of the vehicle air conditioner operation device shown in FIG. 1 when it is completed, and FIGS. 3 (A), (B), and (C) are respectively, section views taken along the lines A—A, B—B, and C—C shown in FIG. 2.

As shown in FIG. 1, the present vehicle air conditioner operation device 10 comprises a printed circuit board 12 on which there are mounted a large number of electronic parts, such as an LCD panel 12A, a rotary volume 12B, a large number of package switches 12C, a female connector 12D, light emitting diodes (which are hereinafter referred to as LEDs) 12E, a large number of box members 20 respectively so disposed as to correspond in position to the package switches 12C and each formed in a box shape including a bottom portion. Also shown: a flexible printed circuit board 30 that includes not only a large number of chip LEDs 30A respectively disposed as to correspond to the package switches 12C, but also connected with the female connector 12D of the print circuit board 12. There also is shown a large number of switch knobs 40 for cooperating with the box members 20 in holding the flexible printed circuit board 30 between them, a main body 50, a cover panel 60 for covering the LCD panel 12A to be mounted on the front surface of the main body 50, a and rotary knob 70 to be attached to the rotary volume 12B. The chip LEDs 30A are small-type LEDs which are mounted on the front surface of a flexible print circuit board and have a green emitting color. Typical LEDs are SML-210MT chip LEDs produced by Rhome Corporation.

Each switch knob 40 includes a common support bar 40A installed at a given position of the back surface of the main body 50, a pair of connecting pieces 40B respectively so formed as to have a small thickness, and an operation panel 40C to be connected to the support bar 40A through the connecting pieces 40B. Since the support bar 40A is fixed to the main body 50 and the connecting pieces 40B are flexible, if the operation panel 40C is pressure operated, then the connecting pieces 40B are flexed so that the operation panel 40C can be oscillated individually. Also, the substantially central portion of the operation panel 40C is treated such that a switch function can be displayed there. The switch function display portion of the operation panel 40C has a property to allow the light to pass therethrough. Further, in the peripheral edge portion of the operation panel 40C, there is formed an engaging projected and recessed portion 40C*a* engageable with an engaging projected and recessed portion 20A which is formed in the peripheral edge portion of the corresponding box member 20. That is, if one pair of engaging projected and recessed portions 20A and 40C*a* are engaged or fitted with each other, then there is produced a small protection space within the switch knob 40 (see FIG. 3 (A) to (C)).

Figure 3A:
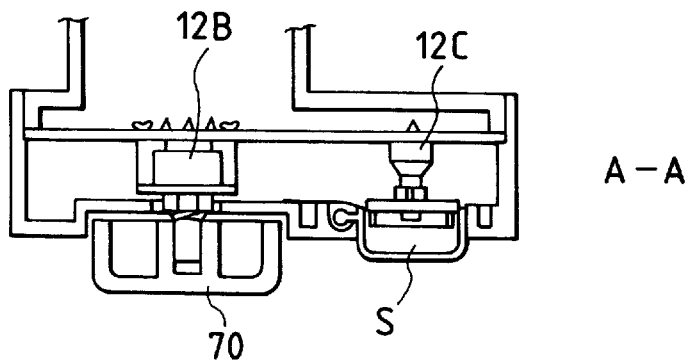
FIGS. 3 (A) to (C) are section views respectively taken along the lines A—A, B—B and C—C shown in FIG. 2.
Figure 3B:
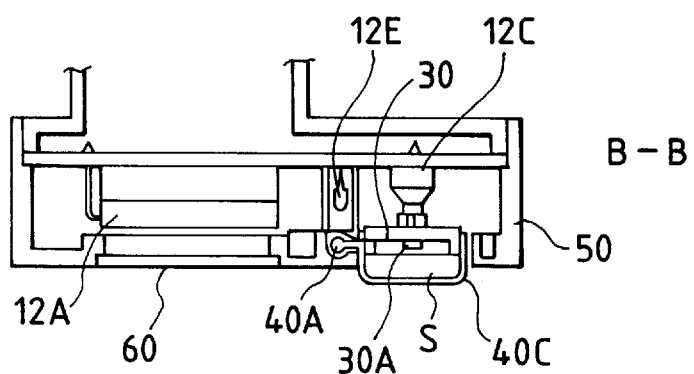
Figure 3C:
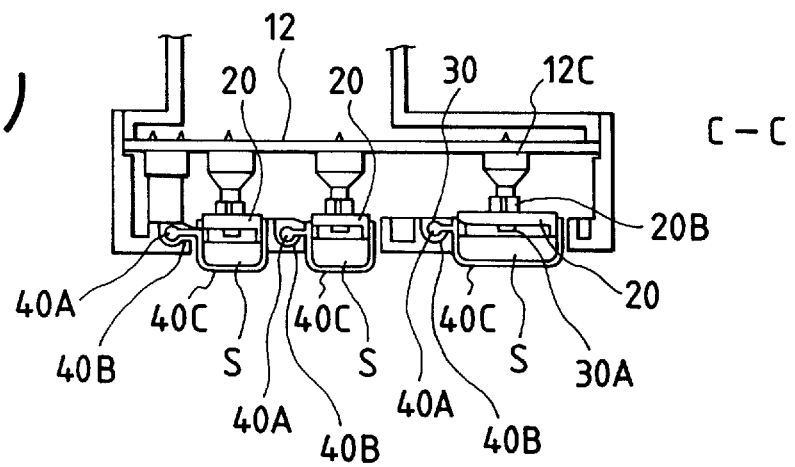

In the central portion of the back surface of the box member 20, there is provided a projection 20B having such a size as allows the projection 20B to come in contact with the corresponding package switch 12C situated in the rear of the present projection 20B (see FIG. 3). Also, the flexible printed circuit board 30 is previously cut away in the portions thereof which respectively correspond to the positions where the engaging projected and recessed portions 20A and 40C*a* of the box member 20 and switch knob 40 are fittable with each other, while electric wires for supply electric power to the flexible print circuit board 30 are arranged in such a manner that they pass around the cutaway portions of the flexible printed circuit board 30. Thus, the respective portions of the flexible printed circuit board 30 on which the chip LEDs 30A are mounted can be oscillated independently of one another.

The main body 50 includes openings in which the LCD panel 12A, rotary volume 12B and LEDs 12E of the printed circuit board 12 are to be Main body 50 also includes openings in which operation panels 40 are to be mounted when the common support bar 40A of the switch knobs 40 is installed at its own given position.

Therefore, when these components are assembled together, as shown in FIG. 3, the flexible printed circuit board 30 is stored in protection spaces S respectively formed by the box members 20 and operation panels 40C, while the chip LEDs 30A are disposed in their respective protection spaces S. Also, the projections 20B of the box members 20 situated on the same axes of the corresponding chip LEDs 30A are respectively brought into contact with their corresponding package switches 12C. The thus package switches 12C project slightly from the main body 50 and face the LCD panel 12A and LEDs 12E mounted on the printed circuit board 12 through the respective openings of the main body 50. This arrangement is similar to that of the operation surface of an ordinary operation device for a vehicle air conditioner.

In the structured vehicle air conditioner operation device 10 according to the present invention, in order to illuminate the operation panels 40C by means of their respective individual chip LEDs 30A, the illuminating colors and luminance thereof can be changed independently of one another. Also, since the chip LEDs 30A, as shown in FIG. 3, are respectively positioned substantially in the central portions of the respective operation panels 40C, they are capable of fully lighting the function displays provided in the respective operation panels 40C. Further, when one of the operation panels 40C is operated, a portion of the flexible printed circuit board 30, which corresponds to the operated operation panel 40C, and the box member 20 corresponding to the operated operation panel 40C are oscillated together about the support bar 40A, thereby causing the projection 20B situated in the central portion of the back surface of the present box member 20 to pressure operate the corresponding package switch 12C. Thus, due to the fact that the package switches 12C are disposed in the backward central portions of the respective operation panels 40C, when the operation panels 40C are operated, there is no possibility that the panels 40C can be inclined, which makes it possible to realize a proper and smooth oscillating operation.

Also, since the flexible printed circuit board 30 and the chip LEDs 30A respectively mounted on the circuit board 30 are used to illuminate the operation panels 40C, a large number of light emitting elements, which must be arranged on the respective back surfaces of a large number of operation panels 40C, can be collected on a thin sheet. Thus, the vehicle air conditioner operation device 10, according to the present embodiment, not only is excellent in the productivity and yield thereof but also can be structured in a thin form. Further, the portions of the flexible printed circuit board 30 on which the chip LEDs 30A are mounted are disposed within the protection spaces S respectively formed by the mutually corresponding operation panels 40C and box members 20. The flexible printed circuit board are therefore protected against external forces, resulting in durability and reliability.

Figure 4:
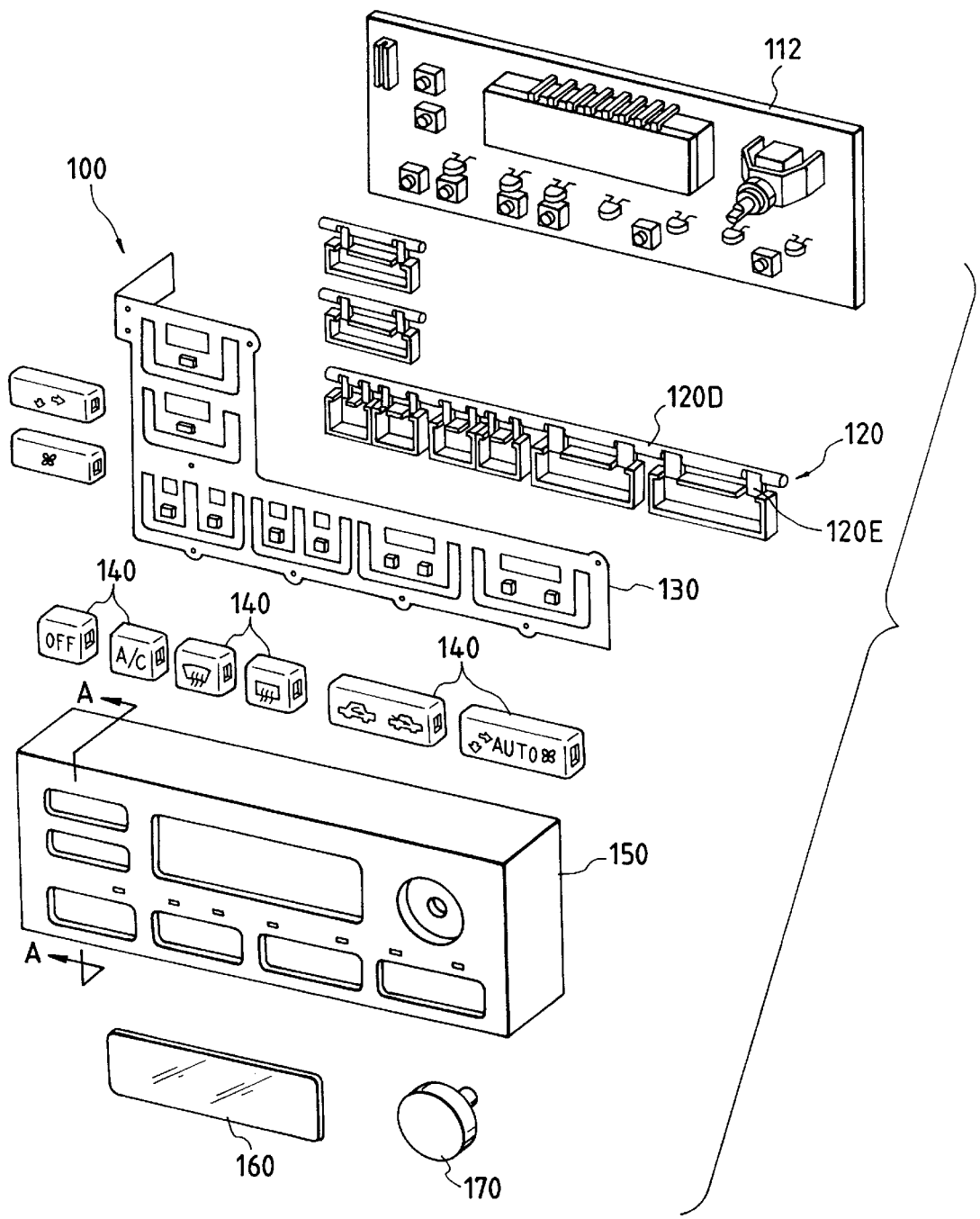
FIG. 4 is an exploded perspective view of a second embodiment of an operation device for a vehicle air conditioner according to the invention.
Figure 5:
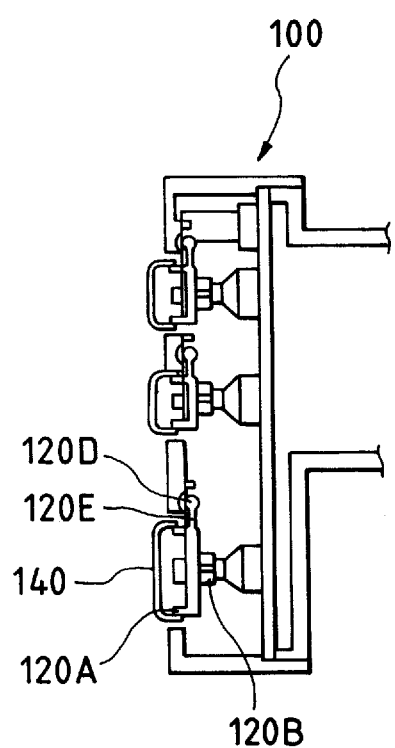
FIG. 5 is a section view taken along the line A—A shown in FIG. 4.

Next, description will be given below of a vehicle air conditioner operation device 100 according to a second embodiment of the invention. FIG. 4 is an exploded perspective view of the vehicle air conditioner operation device 100, while FIG. 5 is a section view of the vehicle air conditioner operation device 100 after it is assembled. The component parts of the second embodiment, that is, a printed circuit board 112, a flexible printed circuit board 130, a main body 150, a cover panel 160, and a rotary knob 170 are the same as in the above-mentioned first embodiment and thus the detailed description thereof is omitted here.

In the present embodiment, box members 120 and switch knobs 140 are partially different in structure from those employed in the first embodiment. That is, in the first embodiment, the support bar 40A and connecting pieces 40B are formed on the switch knobs 40 side and the operation panels 40C and box members 20 can be freely oscillated when the engaging projected and recessed portions 40Ca and 20A thereof are fitted with each other. On the other hand, in the present embodiment, the position relationship between the support bar and connecting pieces is reversed.

Therefore, the box members 120 according to the second embodiment are similar to those of the first embodiment in that projections 120B are formed in the central portions of the back surfaces thereof. However, in the present embodiment, the respective box members 120 are connected to a support bar 120D through connecting pieces 120E, which are formed thin and are thus flexible in such a manner that the box members 120 can be oscillated. Also, the box members 120 are mounted at their respective positions on the back surface of the main body 150 through the support bar 120D. On the other hand, the switch knobs 140 are structured as if they were respectively formed of only the light transmissive operation panels 40C employed in the first embodiment.

The thus structured vehicle air conditioner operation device 100 according to the second embodiment of the invention is also able to fulfil all of the excellent effects of the first embodiment. Further, in the vehicle air conditioner operation device 100 according to the second embodiment of the invention, since the switch knobs 140 are formed as independent members are separated from one another, the quality, color, surface treatment and the like of each of materials forming the switch knobs 140 can be designed freely. Thus, according to the second embodiment, there can be provided a unique effect that the degree of freedom of the switch design can be increased as well as the touch and operation feeling of the switch can be designed individually.

Although description has been given heretofore of the first and second embodiments of the invention, the present invention is not limited to these embodiment at all but, of course, other various kinds of embodiments are also possible without departing from the gist of the present invention.

What is claimed is:

1. An operation device for a vehicle comprising:

an arrangement of a plurality of operation panels, each operation panel being attached to a support bar and including light transmissive portions;

a flexible printed circuit board located behind the plurality of operation panels and having a front side and rear side and a shape corresponding to the arrangement of the plurality of operation panels, the flexible printed circuit board including a plurality of light emitting elements on the front side of the flexible printed circuit board at positions corresponding to the plurality of operation panels, and a plurality of box members positioned on the rear side of the flexible printed circuit board directly behind a corresponding operation panel of the plurality of operation panels such that each box member cooperates with a respective operation panel; and a plurality of switches respectively disposed on the rear side of the flexible printed circuit board and arranged with the box members and behind the operation panels such that the switches are operated in response to the operation of the operation panels when the box members press against the switches, wherein the flexible printed circuit board is structured such that each of the plurality of operation panels is operated with a respective light emitting element located behind the operation panel and wherein the support bar is parallel to the flexible printed circuit board.

2. An operation device for a vehicle as set forth in claim 1, further comprising:

a plurality of protection spaces formed by each of the plurality of operation panels and boxed members, the plurality of protection spaces being located on the rear side of the flexible printed circuit board.

3. An operation device for a vehicle as set forth in claim 1, wherein the light emitting elements are chip LEDs that are mounted on the front side of the flexible printed circuit board.

4. An operation device for a vehicle comprising:

an arrangement of a plurality of operation panels, each operation panel including light transmissive portions;

a flexible printed circuit board located behind the plurality of operation panels and having a front side and rear side and a shape corresponding to the arrangement of the plurality of operation panels, the flexible printed circuit board including a plurality of light emitting elements on the front side of the flexible printed circuit board at positions corresponding to the plurality of operation panels, and a plurality of box members positioned on the rear side of the flexible printed circuit board directly behind a corresponding operation panel of the plurality of operation panels such that each box member cooperates with a respective operation panel, the box members being attached to a support bar; and a plurality of switches respectively disposed on the rear side of the flexible printed circuit board and arranged with the box members and behind the operation panels such that the switches are operated in response to the operation of the operation panels when the box members press against the switches;

wherein the flexible printed circuit board is structured such that each of the plurality of operation panels is operated with the respective light emitting element located behind the operation panel and wherein the support bar is parallel to the flexible printed circuit board.

5. An operation device for a vehicle as set forth in claim 1, wherein the light emitting elements are chip LEDs that are mounted on the front side of the flexible printed circuit board.

6. An operation device for a vehicle as set forth in claim 4, further comprising:

a plurality of protection spaces formed by each of the plurality of operation panels and box members, the plurality of protection spaces being located on the rear side of the flexible printed circuit board.

* * * * *